United States Patent [19]

Tsukikawa et al.

[11] Patent Number: 5,448,516
[45] Date of Patent: Sep. 5, 1995

[54] SEMICONDUCTOR MEMORY DEVICE SUITABLE FOR HIGH INTEGRATION

[75] Inventors: Yasuhiko Tsukikawa; Shigeru Kikuda; Hiroshi Miyamoto, all of Hyogo, Japan

[73] Assignee: Mitsubishi Denki Kabushiki Kaisha, Tokyo, Japan

[21] Appl. No.: 301,753

[22] Filed: Sep. 7, 1994

[30] Foreign Application Priority Data

Sep. 16, 1993 [JP] Japan .................. 5-229995
May 20, 1994 [JP] Japan .................. 6-106663

[51] Int. Cl.⁶ .............................................. G11C 13/00
[52] U.S. Cl. ................................. 365/182; 365/210; 365/200
[58] Field of Search ............ 365/182, 200, 210, 189.01

[56] References Cited

U.S. PATENT DOCUMENTS 5,210,597  5/1993  Kakiuchi et al. ................. 365/185

FOREIGN PATENT DOCUMENTS 63-247991 10/1988 Japan .
3-203094   9/1991 Japan .
4-61161    2/1992 Japan .
5-31236    5/1993 Japan .

*Primary Examiner*—Terrell W. Fears
*Attorney, Agent, or Firm*—Lowe, Price, LeBlanc & Becker

[57] ABSTRACT

A chip is divided into at least four regions of two rows and two columns. In each region, memory array blocks are provided between corresponding first control circuits disposed in the column direction at a constant pitch. A column decoder is disposed adjacent to the first control circuit. Second control circuits are disposed corresponding to the first control circuits. The second control circuits excluding the second control circuit on the column decoder side are formed in the same pattern.

25 Claims, 20 Drawing Sheets

FIG.8
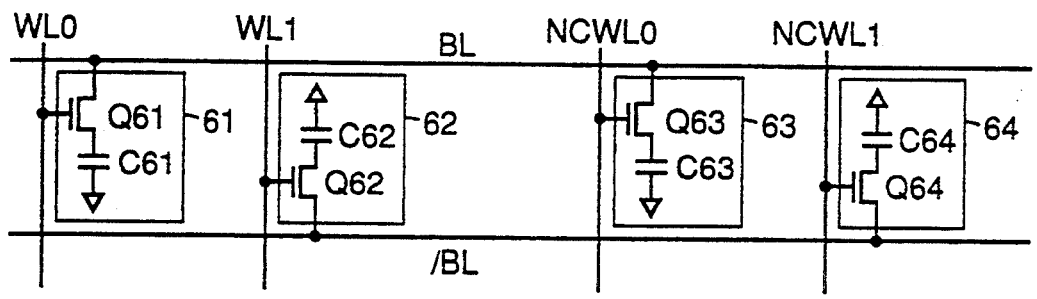
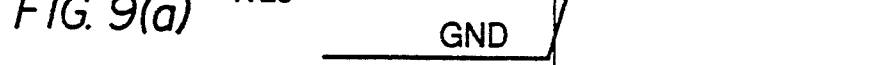
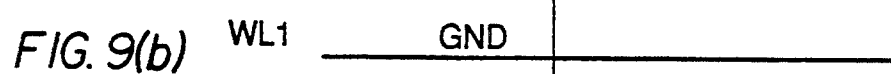
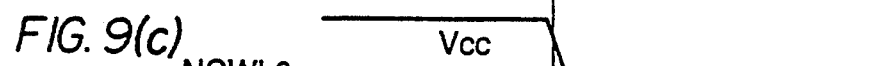
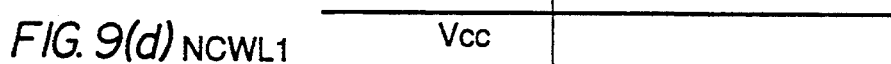

FIG. 10(a) WL0
FIG. 10(b) WL1
FIG. 10(c) NCWL0
FIG. 10(d) NCWL1
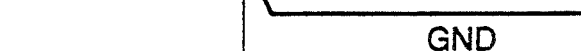

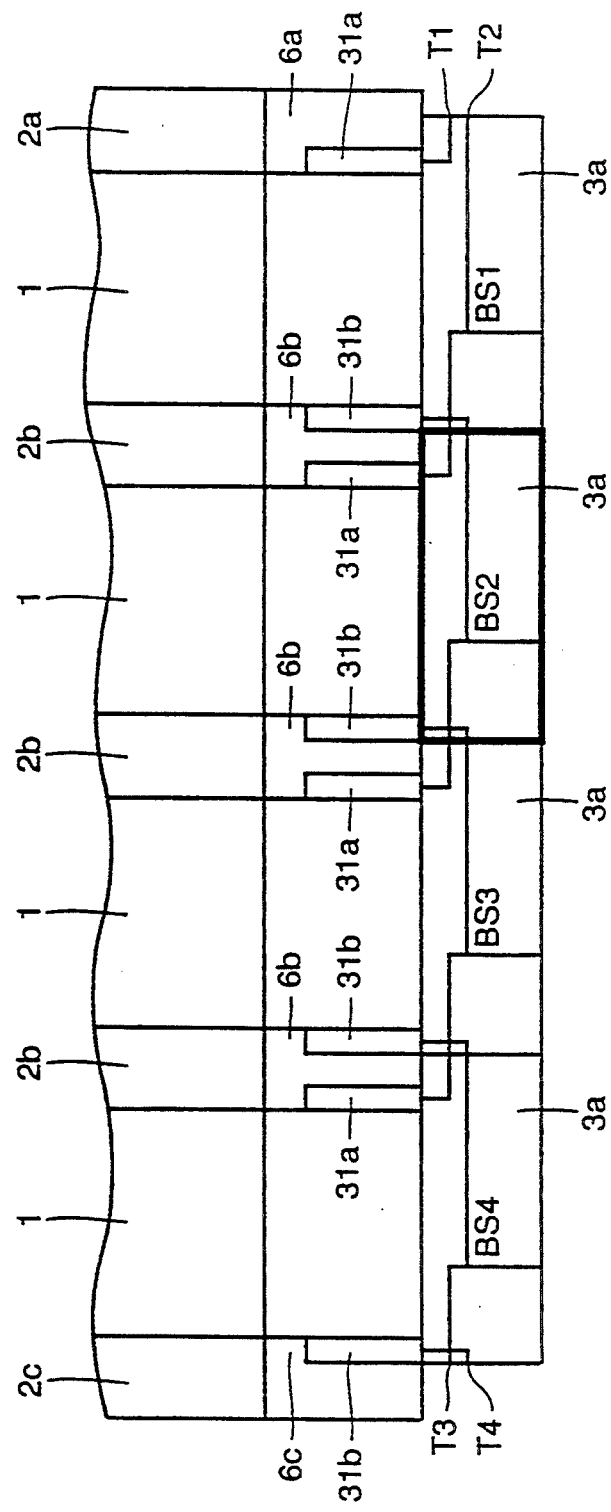

SEMICONDUCTOR MEMORY DEVICE SUITABLE FOR HIGH INTEGRATION

BACKGROUND OF THE INVENTION

1. Field of the Invention

The present invention generally relates to semiconductor memory devices storing information, and more particularly, to a semiconductor memory device suitable for high integration.

2. Description of the Background Art

A semiconductor memory device is used in every device. The storage capacity tends to increase year by year. Increase in the storage capacity leads to increase in the number of elements arranged in a semiconductor device. Therefore, high integration is an important technique in order to dispose a number of elements in a shape similar to a conventional one.

Description will be given hereinafter of a conventional semiconductor memory device with reference to the drawings. FIG. 23 is a diagram showing a configuration of a conventional semiconductor memory device.

Referring to FIG. 23, the semiconductor memory device includes memory array blocks 101, first control circuits 102a to 102c, second control circuits 103a to 103c, column decoders 104, row decoders 105, interconnection portions 106, and a chip 107. Chip 107 is divided into four regions of two rows and two columns. Each region includes memory array blocks 101, first control circuits 102a to 102c, second control circuit 103a to 103c, column decoder 104, row decoders 105 and interconnection portions 106. The regions are symmetrically arranged with respect to the center of chip 107.

Memory array block 101 includes a plurality of memory cells arranged in a matrix, a plurality of bit lines extending in the column direction, and a plurality of word lines extending in the row direction.

First control circuits 102a to 102c each amplify an information signal provided from a bit line of memory array block 101 by a sense amplifier for output of the amplified information signal to an I/O line. First control circuit 102 has a shared sense amplifier configuration, in which one of bit lines of memory array blocks 1 disposed on both sides is selected.

Second control circuits 103a to 103c are connected to first control circuits 102a to 102c through interconnection portions 106 to control operation of first control circuits 102a to 102c.

Column decoder 104 selects a predetermined sense amplifier included in first control circuits 102a to 102c in response to an externally applied address signal.

Row decoder 105 activates a predetermined word line corresponding to the externally applied address signal.

Arrangement of each block will now be described. First control circuits 102a to 102c are regularly disposed at a pitch L, with corresponding memory array blocks 101 interposed therebetween. Therefore, the number of first control circuits 102 is larger than that of memory array blocks 1 by one. Column decoder 104 is disposed in contact with the innermost first control circuit 102c. Row decoder 105 is disposed in contact with corresponding memory array block 1. Therefore, row decoder 105 and memory array block 1 are equal in number. Second control circuits 103a to 103c are disposed in the row direction of first control circuits 102a to 102c with corresponding interconnection portions 106 interposed therebetween. The length of second control circuits 103a to 103c in the column direction is L'. The outer side in the column direction of second control circuit 103a is aligned with the outer side in the column direction of first control circuit 102a. The inner side in the column direction of second control circuit 103c is aligned with the inner side in the column direction of first control circuit 102c. The center line of second control circuit 103b is aligned with the center line of first control circuit 102b.

The memory array blocks and the first control circuits shown in FIG. 23 will now be described in detail.

Description will first be given of first control circuit 102b having memory array blocks 101 disposed on both sides. FIG. 24 is a first diagram showing a configuration of the first control circuits and the memory array blocks shown in FIG. 23.

In FIG. 24, memory array block 101 includes a word line WL, bit lines BL0, /BL0 (in this specification, drawings and claims, /before BL indicates inversion of BL), BL1, /BL1, and memory cells 125, 126. For the sake of simplification, only two memory cells 125, 126 of a plurality of memory cells, only four bit lines BL0, /BL0, BL1, /BL1 of a plurality of bit lines, and only one word line WL of a plurality of word lines are shown in FIG. 24.

Memory cell 125 includes a transistor Q129 and a capacitor C100. As shown in FIG. 24, the memory cell has a structure of one transistor and one capacitor. Bit lines BL0, /BL0 are connected to first control circuit 102b on the left, and bit lines BL1, /BL1 are connected to second control circuit 102b on the right. As to reading or writing of data from or to the memory cell, a predetermined word line, for example, word line WL is activated by row decoder 105, and data of a selected predetermined memory cell is provided to second control circuit 102b through bit lines, for example, bit lines BL0, /BL0.

Second control circuit 102b includes a sense amplifier 120 and transistors Q121 to Q129.

Transistors Q121, Q122, configuring a first switch, controls connection between first control circuit 102b and bit lines of the leftmost memory cell array 101 in the case of first control circuit 102b on the left.

Sense amplifier 120 differentially amplifies data transmitted to one bit line from a memory cell between the one bit line and the other bit line configuring a bit line pair.

Transistor Q123, configuring a second switch, equalizes potentials of the bit line pair.

Transistors Q124, Q125, configuring a third switch, precharge potentials of the bit line pair to a predetermined potential $V_{BL}$.

Transistors Q126, Q127, configuring a fourth switch, transmit data amplified by sense amplifier 120 to the outside world.

Transistors Q128, Q129, configuring a fifth switch, control connection between first control circuit 102b and bit line pair BL0, /BL0 of memory array block 101 on the right in the case of first control circuit 102b on the left.

Second control circuit 102b is configured as described above. Second control circuit 102b selects a predetermined bit line pair out of bit line pairs of memory array blocks 101 provided on both sides by first and fifth switches Q121, Q122, Q128, Q129. After amplifying an information signal of the selected bit line pair by sense amplifier 120, second control circuit 102b transmits the amplified information signal to the outside world through fourth switch Q126, Q127.

Description will now be given of first control circuits 102a, 102c disposed on both ends. FIGS. 25 and 26 are second and third diagrams showing configurations of the memory cell array blocks and first control circuits shown in FIG. 23.

First control circuit 102a shown in FIG. 25 is different from first control circuit 102b shown in FIG. 24 in that the outer contacts of first switch Q121, Q122 are in an open state because memory array block 101 is not disposed on the left side of first control circuit 102a.

First control circuit 102c shown in FIG. 26 is different from first control circuit 102b shown in FIG. 24 in that the outer contacts of fifth switches Q128, Q129 are in an open state, similar to the above, because memory array block 101 is not disposed on the right side of first control circuit 102c.

Therefore, as compared to first control circuit 102b selecting memory array blocks disposed on both sides and amplifying data of predetermined memory cells for output, first control circuits 102a, 102c amplify only data of a memory cell of memory array block 101 disposed on one side for output.

Description will now be given of memory array block 101 in more detail. As high integration of a semiconductor memory device progresses, physical sizes of a memory cell, a word line and a bit line become smaller. Accordingly, it becomes difficult to process uniformly the entire surface of a memory array. By disposing a dummy word line of substantially the same shape as that of a word line used in normal operation and a dummy bit line of substantially the same shape as that of a bit line used in normal operation on the periphery of a memory cell array, the normal word line and bit line are formed in an uniform shape.

FIG. 27 is a diagram showing the configuration of the memory array block shown in FIG. 23. In FIG. 27, the memory array block includes shunt regions 111 of a word line, and memory arrays 110. Memory array 110 is generally disposed in a region surrounded by shunt regions 111 and first control circuits 102. Memory array 110 includes a plurality of word lines, bit lines and memory cells (not shown) used in normal operation. On the periphery of memory array 110, disposed are a dummy word line DWL of substantially the same shape as that of a normal word line and a dummy bit line DBL of substantially the same shape as that of a normal bit line, in order to improve processing precision of a normal word line, bit line and memory cell as described above. As a result, processing precision in memory array 110 is improved, resulting in reduction of the deficiency rate of a normal bit line, word line and memory cell.

Because of the above configuration, the conventional semiconductor memory device has the following problems.

As shown in FIG. 23, second control circuit 103a is connected to interconnection portion 106 at its right side, second control circuit 103b is connected to interconnection portion 106 at its center and second control circuit 103c is connected to interconnection portion 106 at its left side. Therefore, three patterns are required for connection between interconnection portions 106 and second control circuits 103a to 103c, respectively, thereby lowering design efficiency. Since a width L' of the second control circuit must always be smaller than a pitch L of the first control circuit, there exist unused spaces between corresponding second control circuits 103a and 103c, hampering high integration.

Since contacts of first or fifth switch on the side where memory array block 101 is not provided are in an open state, the contacts are charged abnormally, causing malfunction of the device and deterioration of reliability of the device. This problem becomes more significant as charge capacitance of a memory cell is lowered by high integration, resulting in prevention of high integration of the device.

In order to obtain higher integration, it was not possible to maintain uniformity in shape of a bit line, word line and memory cell used in normal operation only by disposing dummy bit line DBL and dummy word line DWL on the periphery of memory arrays 110a to 110d as shown in FIG. 27. It was difficult to achieve higher integration.

SUMMARY OF THE INVENTION

One object of the present invention is to provide a semiconductor memory device which can implement higher integration.

Another object of the present invention is to provide a semiconductor memory device with high uniformity in shape and high yield.

A still another object of the present invention is to provide a semiconductor memory device which can implement stable operation with improved reliability.

A semiconductor memory device according to one aspect of the present invention includes a plurality of memory array blocks disposed in the row direction, a plurality of first control circuits provided at either side of the respective memory array blocks, and including at least a sense amplifier circuit, a column decoder provided in parallel with the first control circuit provided at one end side of the plurality of first control circuits, a plurality of row decoders provided corresponding to the respective memory array blocks, and a plurality of second control circuits provided corresponding to the respective first control circuits. The width of a column decoder forming region on the surface of a semiconductor substrate is substantially equal to the width of a memory array block forming region on the surface of the semiconductor substrate. The second control circuits are formed in the same pattern excluding the second control circuit corresponding to one first control circuit positioned on the column decoder side out of the plurality of first control circuits.

Because of the above configuration, it is possible to improve design efficiency of the device as well as to form the device with high precision, resulting in higher integration.

A semiconductor memory device according to another aspect of the present invention includes a plurality of memory cells disposed in rows and columns, a plurality of select lines for selecting memory cells in one of the row and column directions out of the plurality of memory cells, dummy select lines disposed on the outer sides of the select lines on both ends out of the plurality of select lines, and having substantially the same shape as that of the select line, and a spare select line disposed between the dummy select lines and the plurality of select lines, and having substantially the same shape as that of the select line.

Because of the above configuration, the dummy select lines, the spare select line and the select lines are disposed in order from the periphery of the memory array block. Therefore, it is possible to improve uniformity in shape and yield of the select lines and memory cells positioned inside, resulting in higher integration.

According to still another aspect of the present invention, a semiconductor memory device includes a plurality of memory cells disposed in rows and columns, a plurality of word lines for selecting memory cells in the row direction out of the plurality of memory cells, a plurality of bit lines for selecting memory cells in the column direction out of the plurality of memory cells, dummy word lines disposed on the outer sides of the word lines on both ends out of the plurality of word lines, and having substantially the same shape as that of the word line, and a noise cancel word line provided between the dummy word lines and the plurality of word lines for canceling variation of the potential of the bit line.

Because of the above configuration, the dummy word lines and the noise cancel word line are disposed in order from the periphery of the memory block. The word lines, the bit lines and the memory cells can be disposed inside in the memory array block. Therefore, it is possible to improve uniformity in shape and yield of the word line, bit line and memory cell, resulting in higher integration.

According to a further aspect of the present invention, a semiconductor memory device includes a plurality of memory array blocks disposed in the row direction and storing information, and a plurality of amplifying circuits provided at either side of the respective memory array blocks, and amplifying an information signal provided from the memory array block. The amplifying circuit further includes first and second connecting circuits selectively connecting memory array blocks disposed on both sides. The connection points of the first and second connecting circuits of the amplifying circuit to which the memory array block is not connected are fixed to a predetermined potential.

Because of the above configuration, the connection points of the first and second connecting circuits not connected to the memory array block are not charged abnormally. As a result, it is possible to prevent malfunction of the device, to improve reliability of the device, and to implement higher integration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing a configuration of a word line and the noise cancel word line.

FIGS. 9(a)-9(d) and 10(a)-10(d) are first and second diagrams for explaining operation of the noise cancel word line, respectively.

FIG. 29 is a diagram for explaining layout of a signal line transmitting a bit line separation signal included in the second control circuit.

DESCRIPTION OF THE PREFERRED EMBODIMENTS

Figure 1:
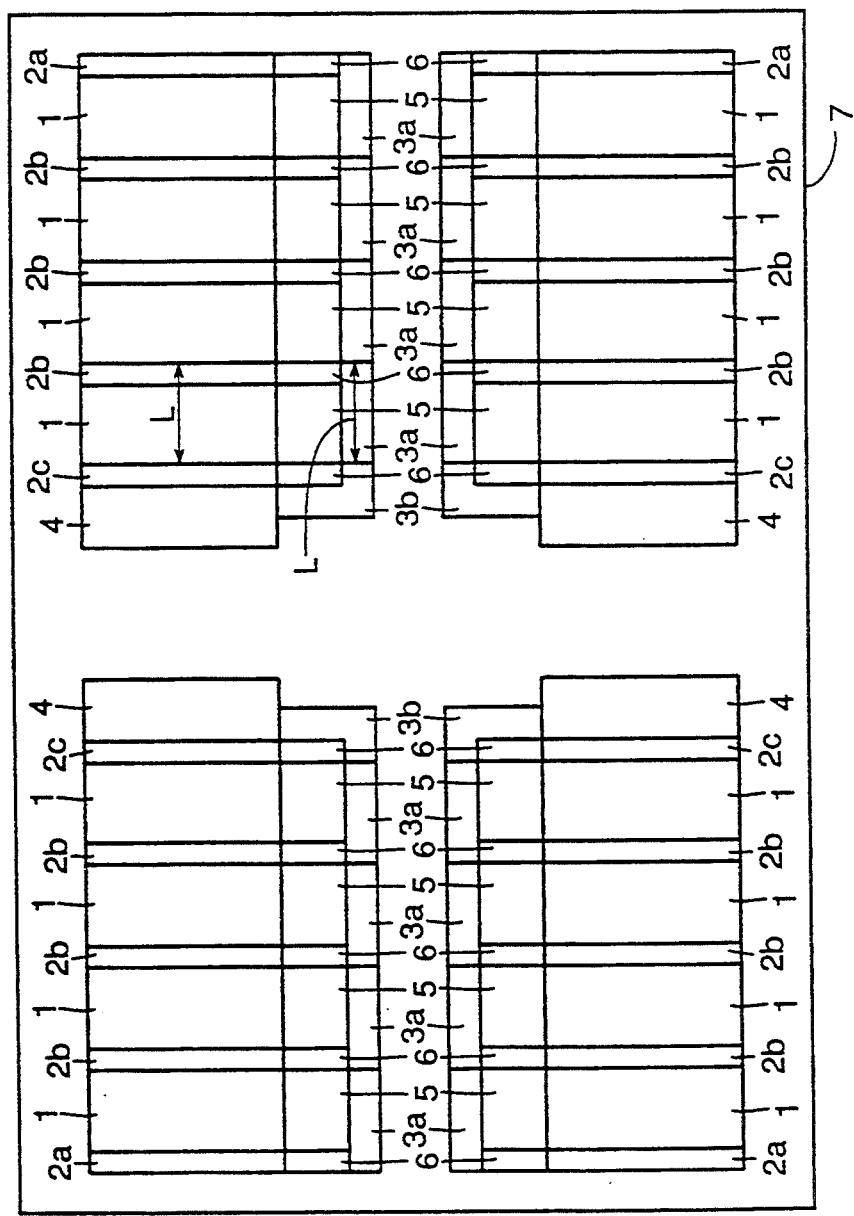
FIG. 1 is a diagram showing a configuration of a semiconductor memory device according to one embodiment of the present invention.

One embodiment of the present invention will now be described with reference to the drawings. FIG. 1 is a diagram showing a configuration of a DRAM (Dynamic Random Access Memory) serving as a semiconductor memory device according to one embodiment of the present invention.

The semiconductor memory device shown in FIG. 1 includes memory array blocks 1, first control circuits 2a to 2c, second control circuits 3a and 3b, column decoders 4, row decoders 5, interconnection portions 6 and a chip 7.

Figure 23:
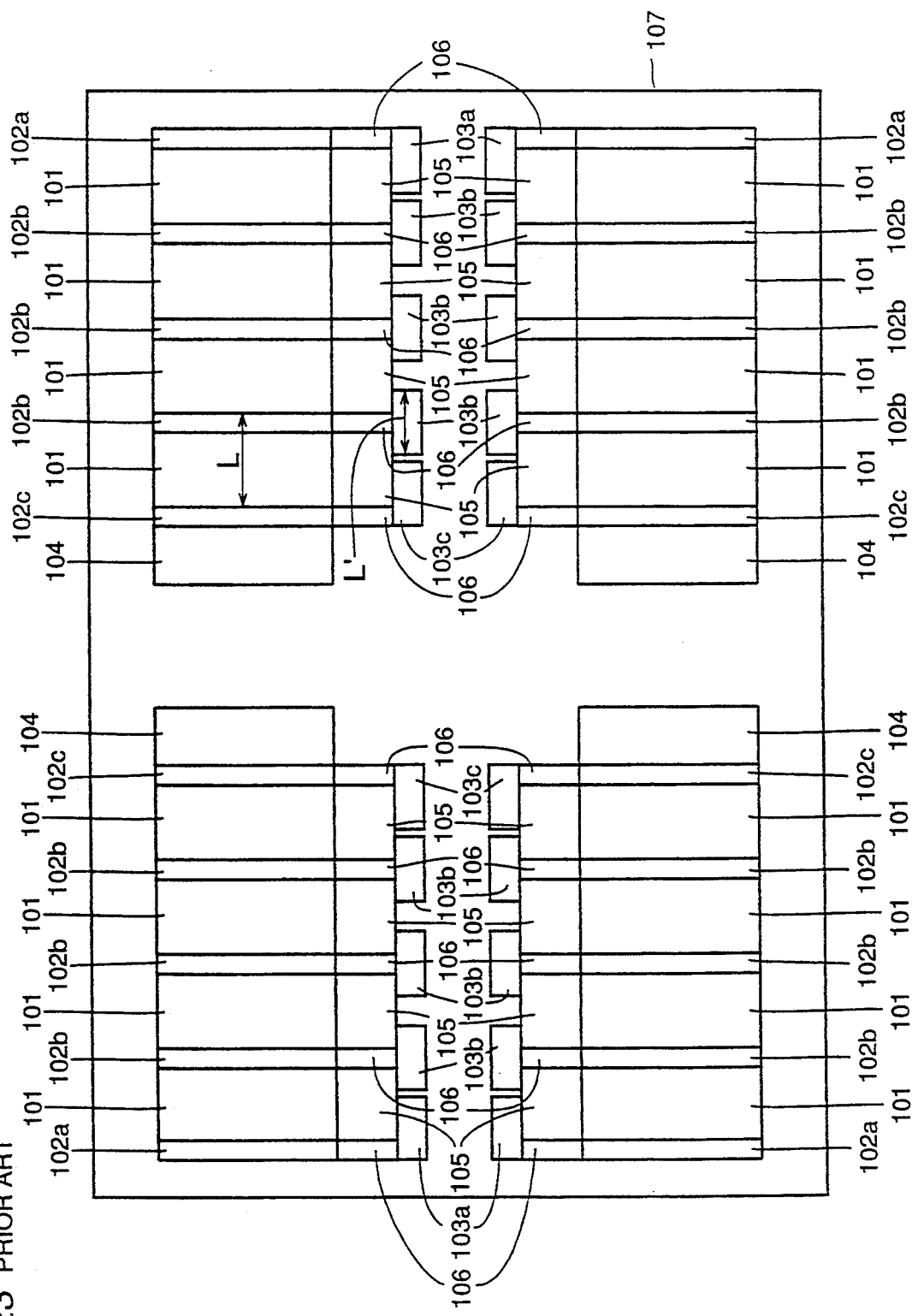
FIG. 23 is a diagram showing a configuration of a conventional semiconductor memory device.
Figure 24:
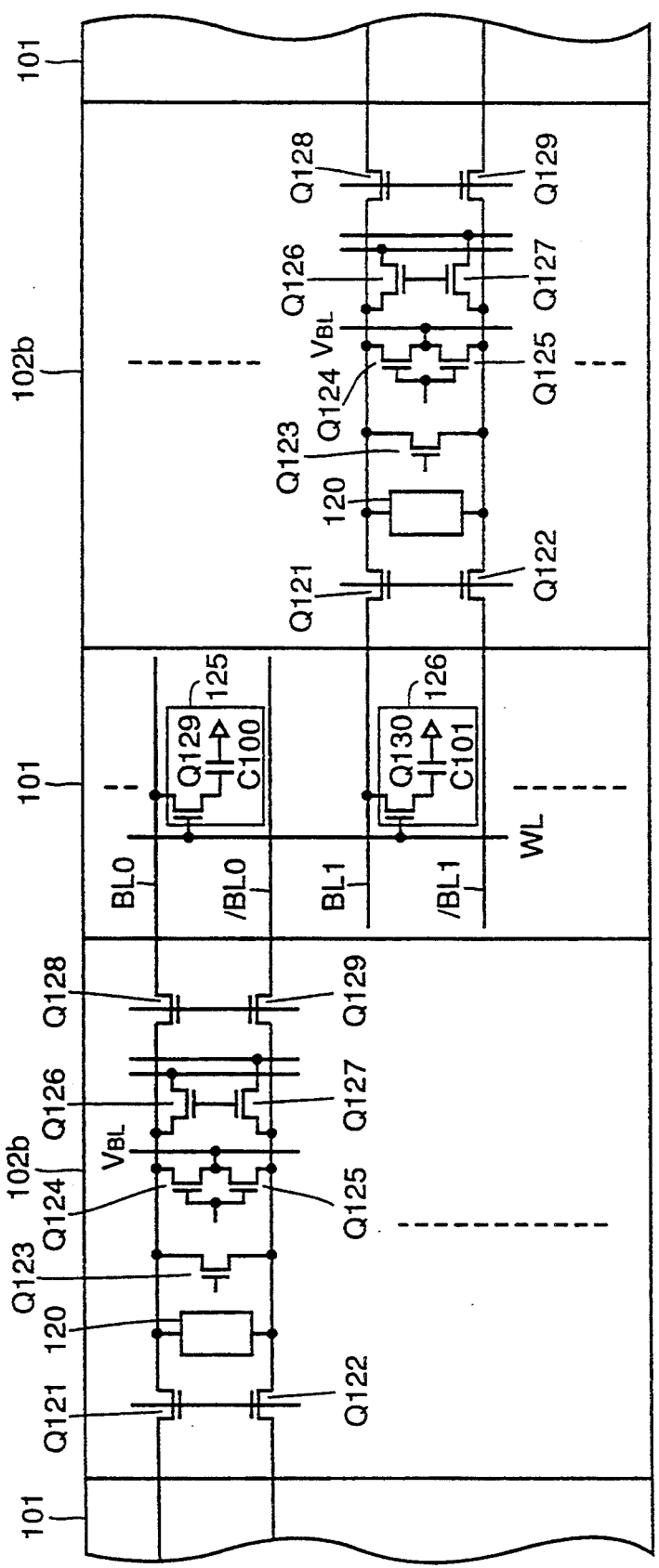
FIGS. 24 to 26 are first to third diagrams showing a configuration of a first control circuit shown in FIG. 23.
Figure 25:
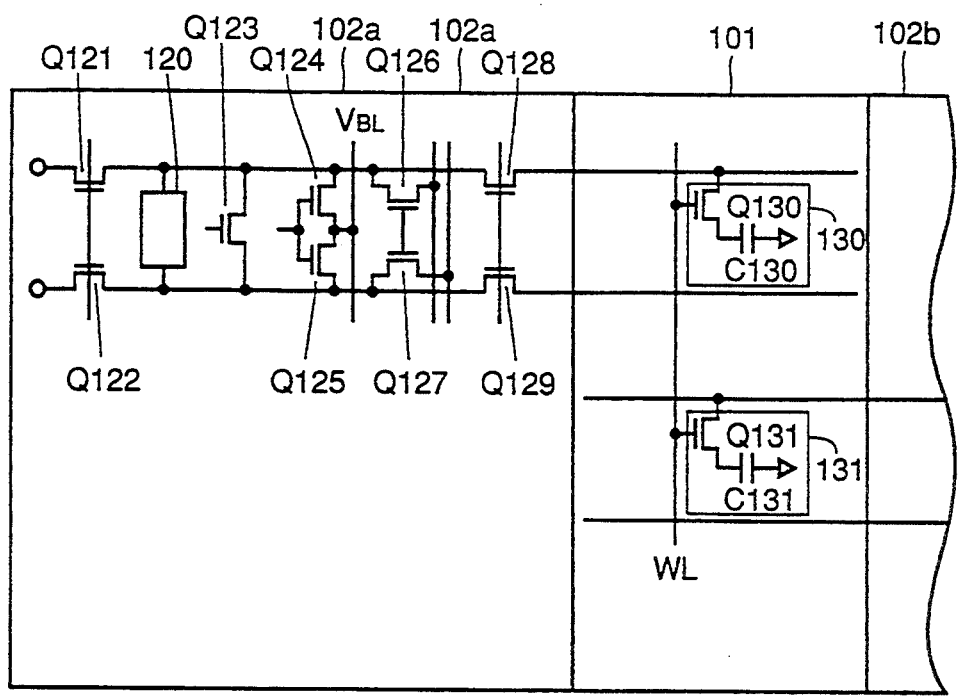
Figure 26:
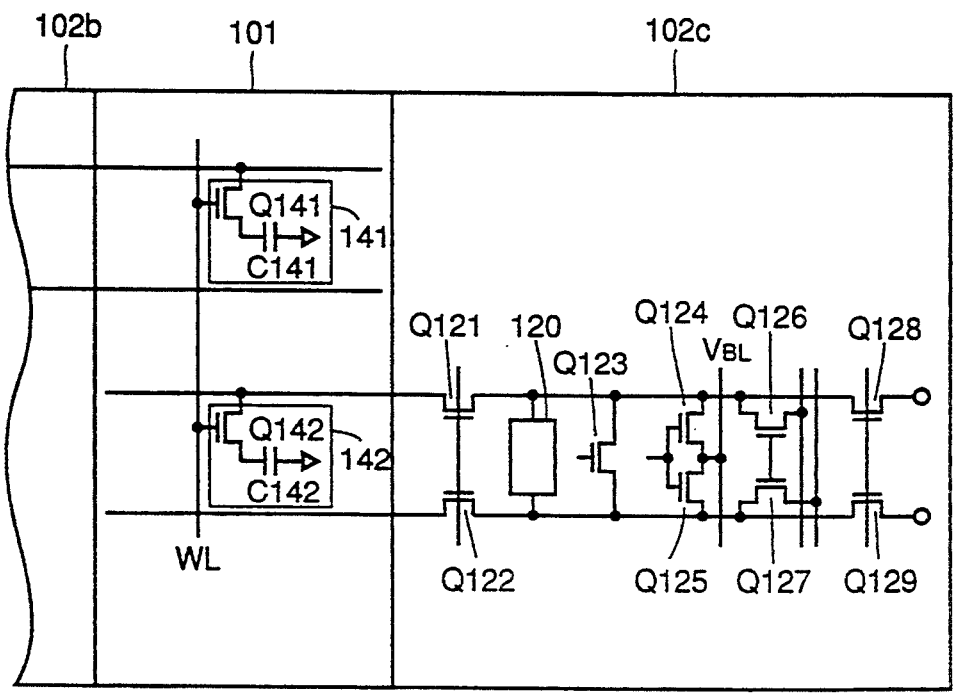
Figure 27:
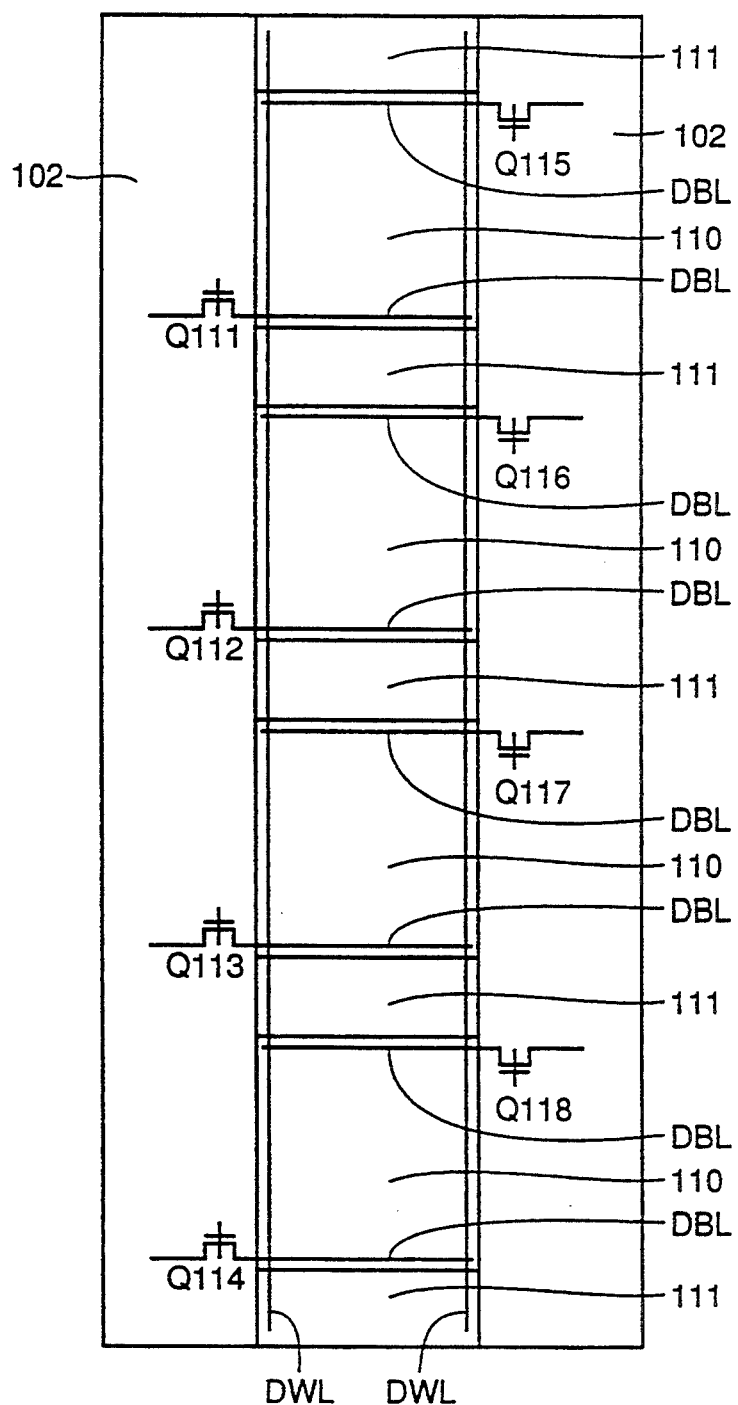
FIG. 27 is a diagram showing a configuration of a memory array block shown in FIG. 23.

Chip 7 of the semiconductor memory device is divided into four planes. Each plane includes memory array blocks 1, first control circuits 2a to 2c, second control circuits 3a and 3b, column decoder 4, row decoders 5, and interconnection portions 6. Respective planes are disposed in two rows and two columns in symmetry with respect to the center of the four planes. Since operation of each circuit is similar to that of the conventional semiconductor memory device shown in FIG. 23, the description will not be repeated. Arrangement in each circuit will be described hereinafter.

First control circuits 2a to 2c are disposed in the column direction at constant pitch L. Memory array blocks 1 are disposed between corresponding first control circuits 2a to 2c. Row decoders 5 are disposed between corresponding interconnection portions 6.

Column decoder 4 is disposed in contact with first control circuit 2c provided at the inner side of each plane. Second control circuits 3a and 3b each has one side substantially aligned with the outer side of a corresponding one of first control circuits 2a to 2c in the column direction, with interconnection portions 6 interposed therebetween. As a result, connection portions of interconnection portions 6 and second control circuits 3a, 3b are fabricated using the same pattern, thereby improving design efficiency of the semiconductor device. The width of second control circuit 3a can be increased up to the pitch L of first control circuits 2a to 2c, making this configuration suitable for high integration. Furthermore, bent into an approximately L-letter shape, second control circuit 3b can be disposed in contact with the periphery of interconnection portion 6 and column decoder 4, resulting in effective use of the space on chip 7. Since second control circuit 3b is bent into an approximately L-letter shape, the plane has no recessed portion in its external shape. When another circuit is arranged on the vacant space, it is not necessary to make connection around otherwise projected second control circuit 3b. As a result, an easy and short interconnection is obtained, thereby improving high speed of a signal transmitted through the interconnection.

Although interconnection portion 6 only serves as an interconnection portion between second control circuits 3a, 3b and first control circuits 2a to 2c, interconnection portion 6 includes a part of second control circuit 3a disposed therein.

Description will now be given of a specific example of circuits included in second control circuits 3a, 3b. In second control circuit 3a, included are a memory array block control circuit and a sense amplifier control circuit. In second control circuit 3b on the side of column decoder 4, the sense amplifier control circuit, for example, is included, and the memory array block control circuit is not included. When n memory array blocks are laid out, n memory array block control circuits are required, because one memory array block control circuit is required for every memory array block. With regard to the sense amplifier control circuit, n+1 sense amplifier control circuits are required, because one sense amplifier control circuit is required for every first control circuit including a sense amplifier.

The memory array block control circuit includes, for example, a predecode signal generating circuit for generating a predecode signal divided into blocks, a noise cancel word line drive circuit for driving a noise cancel word line, and a word line activate signal generating circuit for generating a signal activating or non-activating a word line. These circuits are associated with addressing, which are required for activating or non-activating a word line, and required for every memory array block. The memory array block control circuit further includes circuitry associated with selection of a spare word line. The circuitry is required when the spare word line is arranged in every memory array block. The memory array block control circuit further includes a bit line separation signal generating circuit for generating bit line separation signals $\phi_{BLR}$, $\phi_{BLL}$. Since two bit line separation signals are required for every memory array block, only a part of the bit line separation signal generating circuit is required for first control circuits 2a, 2c provided on both ends out of the first control circuits. In this case, a part of the bit line separation signal generating circuit for generating unnecessary bit line separation signal $\phi_{BLR}$ or $\phi_{BLL}$ is not laid out. The ground potential is applied to the gate of first switch Q71, Q72 or fifth switch Q98, Q99 controlling connection between the bit lines and the first control circuit, to be described later, and the first or fifth switch is in an off state (refer to FIGS. 20 and 21).

Circuits included in the sense amplifier control circuit are different between a normal I/O configuration and a hierarchical I/O configuration. For example, in the normal I/O configuration, the sense amplifier control circuit includes a bit line equalize signal generating circuit for generating a bit line equalize signal, and a sense amplifier drive signal generating circuit for generating sense amplifier drive signals $\phi_N$, $\phi_P$. The sense amplifier drive signal generating circuit sometimes generates two signals $\phi_{Nf}$ and $\phi_{NS}$ instead of sense amplifier drive signal $\phi_N$ for two-stage sensing. In the hierarchical I/O configuration, the sense amplifier control circuit further includes a switch gate control signal generating circuit for generating a signal controlling a switch gate for connection between a sub I/O line and a main I/O line.

The above-described circuits are included in second control circuits 3a, 3b, if necessary. A part of the bit line separation signal generating circuit and a part of the word line activate signal generating circuit are disposed in a predetermined region of interconnection portion 6 shown in FIG. 1.

Figure 28:
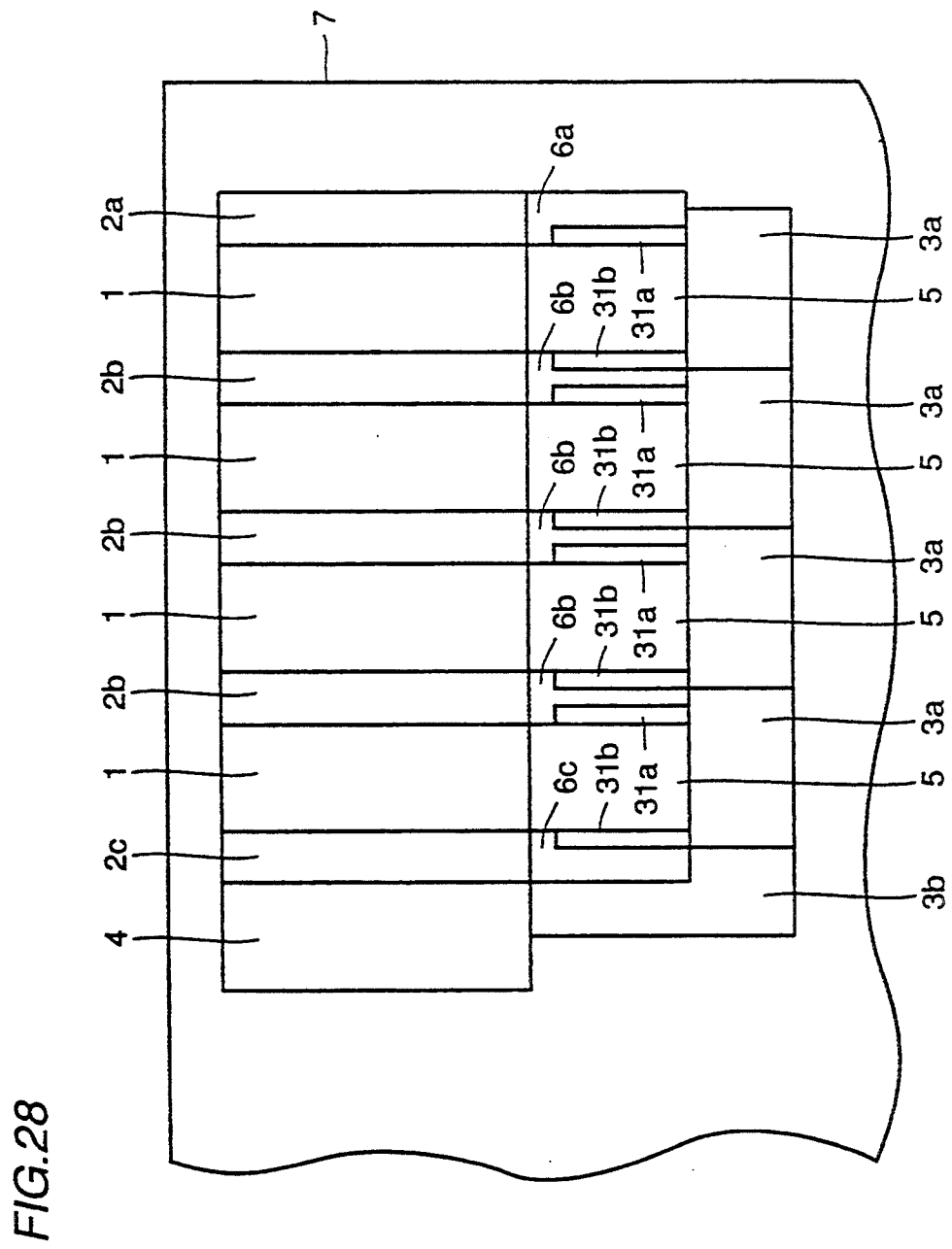
FIG. 28 is an enlarged view of one plane shown in FIG. 1.

Arrangement of each of the above circuits will be described in more detail. FIG. 28 is an enlarged view of one plane, showing the left upper plane of FIG. 1.

Referring to FIG. 28, respective portions 31a, 31b of second control circuits 3a are laid out in interconnection portions 6a to 6c. More specifically, as described above, a part of the word line activate signal generating circuit and a part of the bit line separation signal generating circuit of the memory array block control circuit are laid out in portions 31a, 31b of second control circuit 3a. Therefore, second control circuit 3a includes the memory array block control circuit excluding a part of the word line activate signal generating circuit and a part of the bit line separation signal generating circuit, and the sense amplifier control circuit. On the other hand, second control circuit 3b includes the sense amplifier control circuit, and does not include the memory array block control circuit.

For example, one portion 31a of the rightmost second control circuit 3a is disposed in interconnection portion 6a. The other portion 31b of the rightmost second control circuit 3a is disposed in the second interconnection portion 6b from the right. Other second control circuits 3a and their portions 31a and 31b are disposed similarly. Therefore, second control circuits 3a and their portions 31a and 31b are repeatedly laid out in the same pattern, resulting in improvement of design efficiency and processing precision of the semiconductor device. This arrangement is suitable for high integration.

Both ends of second control circuit 3a are defined by the left end of portion 31b and the left end of portion 31b of adjacent second control circuit 3a. Therefore, the rightmost second control circuit 3a opposite to the column decoder 4 side is shifted inside from the right end side of interconnection portion 6a by the width of portion 31b of second control circuit 3a.

On the other hand, second control circuit 3b positioned at an end portion on the column decoder 4 side is disposed along the side surface of interconnection portion 6c and column decoder 4. Second control circuit 3b is bent into an approximately L-letter shape. Therefore, there is no unused space on chip 7, resulting in effective use of the space.

Description will now be given of a layout of signal lines for transmitting the bit line separation signal included in the second control circuit with reference to FIG. 29. Similar to FIG. 28, FIG. 29 is an enlarged diagram showing the right upper plane of the four planes shown in FIG. 1. Second control circuit 3b and column decoder 4 are not shown which are not laid out in the same pattern.

Referring to FIG. 29, signal lines BS1 to BS4 transmitting the bit line separation signal are respectively disposed in second control circuits 3a. For example, one end of signal line BS2 extends to portion 31b of second control circuit 3a included in interconnection portion 6b on the right, and the other end of signal line BS2 extends to portion 31a of second control circuit 3a included in interconnection portion 6b on the left. Therefore, second control circuits 3a are repeatedly laid out using a portion indicated by a thick line of FIG. 29 as a pattern. As to a portion having no corresponding signal line, end portion T1 of the signal line is connected to the ground potential, and end portion T2 of the signal line is in an open state, for example. End portion T3 of the signal line on the left is in an open state, and end portion T4 of the signal line is connected to the ground potential.

Because of the above-described layout, it is possible to form a plurality of second control circuits on chip 7 by repeating the layout pattern of second control circuit 2a. Improvement of design efficiency and processing precision of the semiconductor device can be implemented, thereby providing a semiconductor memory device suitable for high integration.

Figure 2:
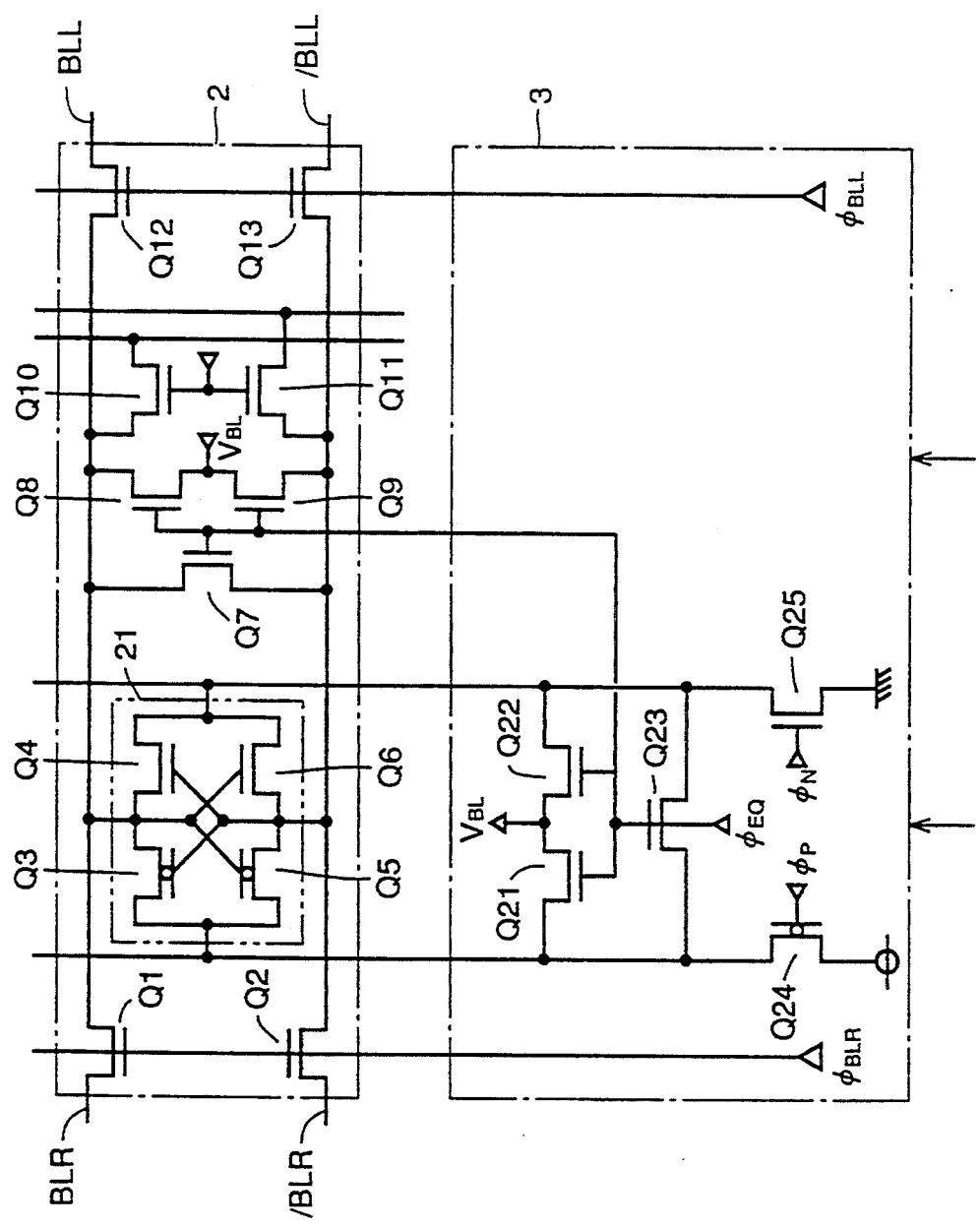
FIG. 2 is a diagram showing a first specific example of first and second control circuits shown in FIG. 1.
Figure 3:
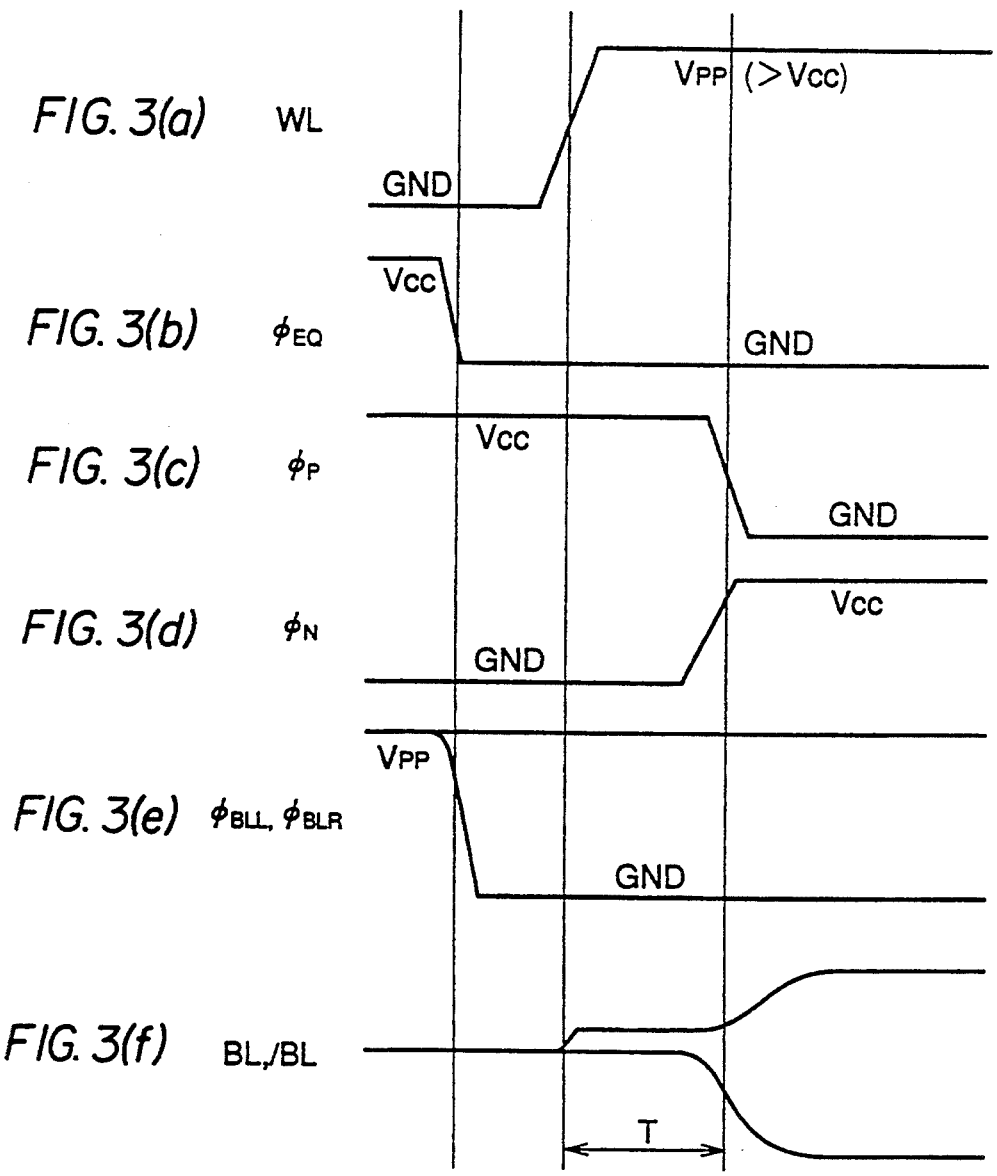
FIGS. 3(a)-3(f) is a timing chart for explaining operation of the second control circuit shown in FIG. 2.

More detailed description will be given of the first control circuit and the second control circuit. FIG. 2 is a diagram showing a configuration of the first specific example of the first and second control circuits shown in FIG. 1.

Referring to FIG. 2, a first control circuit 2 includes a sense amplifier 21, and transistors Q1, Q2, Q7 to Q13. Sense amplifier 21 includes transistors Q3 to Q6. Second control circuit 2 includes each above element in plural, and controls a plurality of bit lines.

A second control circuit 3 includes transistors Q21 to Q25. A block select signal B and a sense timing signal ST are applied to second control circuit 3. Second control circuit 3 operates in response to block select signal B, and sets delay times of PMOS sense amplifier drive signal $\phi_P$ and NMOS sense amplifier drive signal $\phi_N$ with respect to a signal of word line WL in response to sense timing signal ST. Therefore, second control circuit 3 internally generates bit line separation signals $\phi_{BLL}$, equalize signal $\phi_{EQ}$, PMOS sense amplifier drive signal $\phi_P$, NMOS sense amplifier drive signal $\phi_N$, and a signal of a predetermined potential $V_{BL}$ for precharging a bit line pair by predetermined circuits (not shown) based on block select signal B and sense timing signal ST, and outputs each signal to first control circuit 2.

Transistors Q1, Q2 of first control circuit 2 are, configuring a first switch, turned on or off in response to bit line separation signal $\phi_{BLR}$ to control connection between bit line pair BLR, /BLR and first control circuit 2. Transistors Q12, Q13 are, configuring a fifth switch, and turned on or off in response to bit line separation signal $\phi_{BLL}$ to control connection between bit line pair BLL, /BLL and first control circuit 2. Sense amplifier 21 differentially amplifies a data signal provided from a bit line pair to which it is connected, by output signals of transistors Q24, Q25 receiving PMOS and NMOS sense amplifier drive signals $\phi_P$, $\phi_N$ at their gates. Transistor Q7 configures a second switch, and receives equalize signal $\phi_{EQ}$ at its gate to equalize potentials of a bit line pair to which it is connected. Transistors Q8, Q9 configure a third switch and receive equalize signal $\phi_{EQ}$ at their gates to precharge potentials of a bit line pair to which they are connected to a predetermined potential $B_{BL}$. Transistors Q10, Q11 configure a fourth switch, and transmit the data signal amplified by sense amplifier 21 to the outside world.

Operation of second control circuit 3 will now be described. FIGS. 3(a)-3(f) is a timing chart explaining operation of the second control circuit shown in FIG. 2.

Second control circuit 3 pulls down equalize signal $\phi_{EQ}$ from the power supply voltage $V_{CC}$ to the ground potential, and pulls down one of bit line separation signals $\phi_{BLL}$, $\phi_{BLR}$ from the boosted voltage $V_{PP}$ to the ground potential. After delay of a predetermined delay time T set by sense timing signal ST from the rising timing of a signal of word line WL, second control circuit 3 pulls down PMOS sense amplifier drive signal $\phi_P$ from the power supply voltage $V_{CC}$ to the ground potential, and pulls up NMOS sense amplifier drive signal $\phi_N$ from the ground potential to the power supply voltage $V_{CC}$. In response to this, a signal of bit lines Bl, /BL is changed as shown in FIGS. 3(a)-3(f), and amplified by sense amplifier 21. By the above operation, first control circuit 2 is controlled by second control circuit 3, and first control circuit 2 amplifies a data signal of a predetermined bit line pair of memory cell arrays disposed on both sides for output.

Description will now be given of the second specific example of the first and second control circuits shown in FIG. 1 with reference to FIG. 4.

Figure 4:
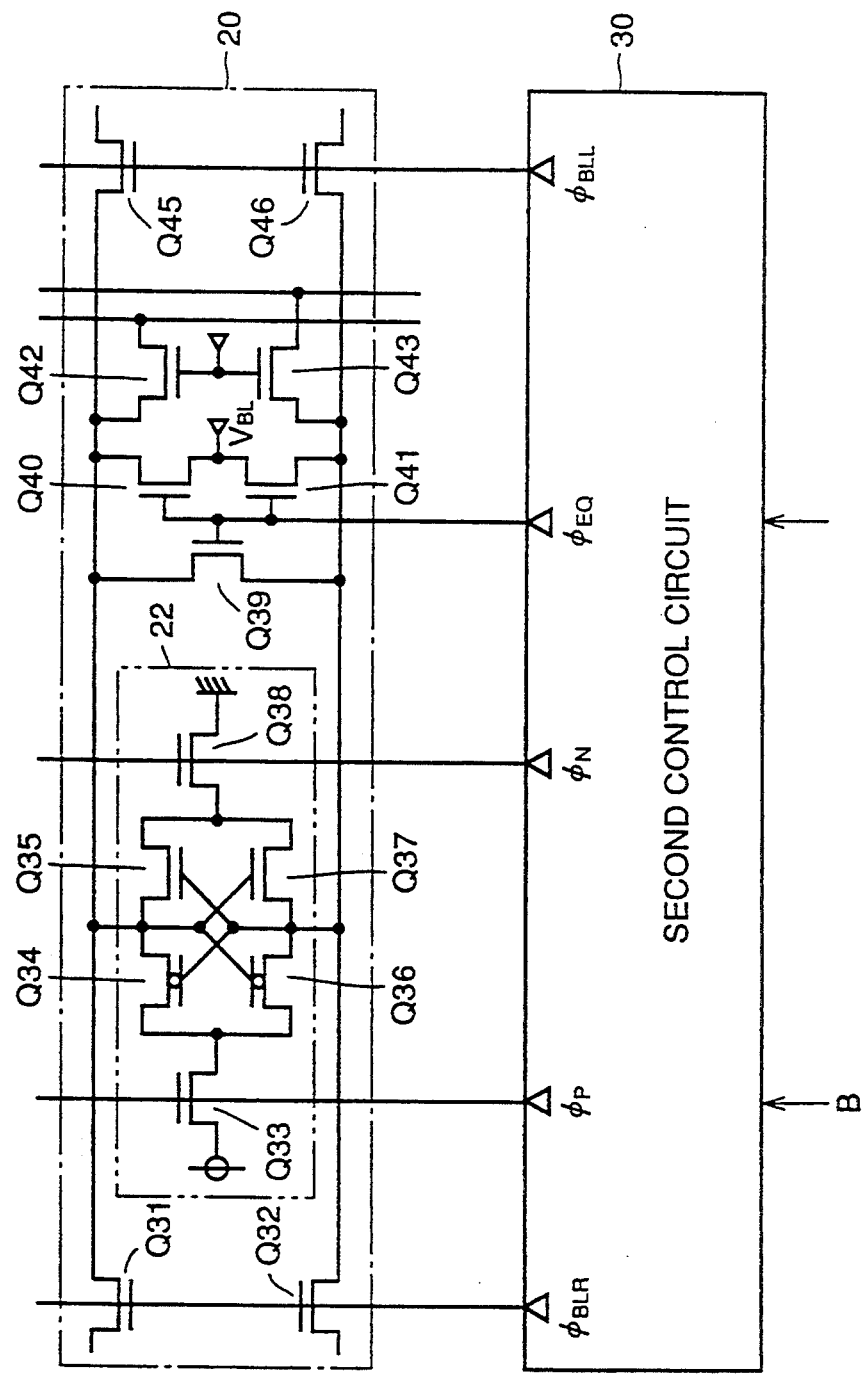
FIG. 4 is a diagram showing a second specific example of the first and second control circuits shown in FIG. 1.

A second control circuit 30 shown in FIG. 4 is different from second control circuit 3 shown in FIG. 2 in that second control circuit 30 outputs PMOS and NMOS sense amplifier drive signals $\phi_P$, $\phi_N$ directly to a first control circuit 20, and that transistors Q33, Q38 receiving PMOS and NMOS sense amplifier drive signals $\phi_P$, $\phi_N$ at their gates are additionally provided in a sense amplifier 22 of first control circuit 20. Since operation of first control circuit 20 and second control circuit 30 shown in FIG. 4 is similar to that of first control circuit 2 and second control circuit 3 shown in FIG. 2 excluding the above points, the description will not be repeated.

The first and second circuits operating as described above can be disposed as first control circuits 2a to 2c and second control circuits 3a, 3b shown in FIG. 1. However, second control circuit 3b does not include a memory array block control circuit, such as a bit line separation signal generating circuit, as described before.

Figure 5:
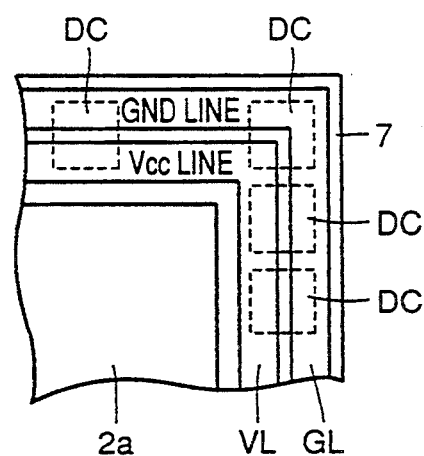
FIG. 5 is a diagram for explaining arrangement of a power supply line, a ground line and a decoupling capacitor of the semiconductor memory device shown in FIG. 1.

Description will now be given of an arrangement of a power supply line, a ground line and a decoupling capacitor between power and ground lines in the semiconductor device shown in FIG. 1 with reference to FIG. 5. FIG. 5 shows one of four corners of chip 7.

Referring to FIG. 5, power supply line VL and ground line GL are disposed at the periphery of chip 7, and a decoupling capacitor DC for suppressing power supply ground noise is disposed between power supply line VL and ground line GL. As shown in FIG. 1, since there is no irregularity in the plane at the periphery of chip 7 in this embodiment, it is possible to dispose power supply line VL, ground line GL and decoupling capacitor DC in contact with the periphery of the plane. The chip size does not increase, and the arrangement is suitable for high integration.

Figure 6:
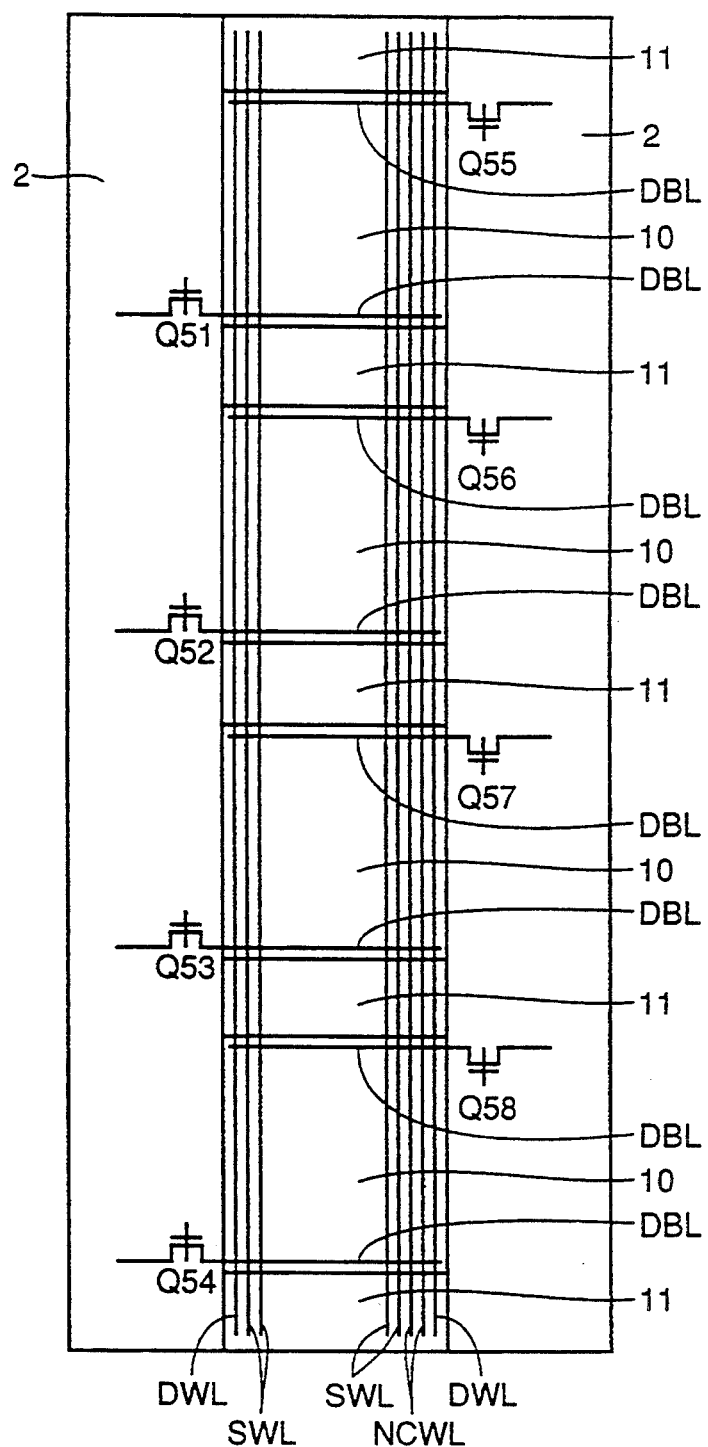
FIG. 6 is a diagram for explaining a first configuration of a memory array block shown in FIG. 1.

Description will now be given of memory array block 1 shown in FIG. 1 in more detail. FIG. 6 is a diagram showing the first configuration of the memory array block shown in FIG. 1.

Referring to FIG. 6, the memory array block includes shunt regions 11 of a word line, memory arrays 10, dummy bit lines DBL, dummy word lines DWL, noise cancel word lines NCWL, and spare word lines SWL. In the memory array block shown in FIG. 6, one dummy bit line is disposed on each of the upper and lower sides of memory array 10, one dummy word line DWL and two spare word lines SWL are on the left side of memory array 10, and one dummy word line DWL, two noise cancel word lines NCWL and two spare word lines SWL are disposed on the right side of memory array 10. A plurality of bit lines, word lines and memory cells used in normal operation are disposed in each memory array (not shown). Since normal bit lines, word lines and memory cells are disposed in the innermost of a memory array, uniformity in shape and yield of the normal bit lines, word lines and memory cells are improved.

As to the order of arrangement of dummy word line DWL, noise cancel word line NCWL, and spare word line SWL, dummy word line DWL is positioned outermost, noise cancel word line NCWL is positioned adjacent to the dummy word line and spare word line SWL is finally disposed. Dummy word line DWL does not function electrically. On the other hand, noise cancel word line NCWL is not directly associated with reading of memory cells. However, in selecting a word line and reading out data from memory cells, noise cancel word line NCWL operates in the opposite phase to the selected word line so that it will cancel variation of the potential of a bit line caused by capacitance coupling between the word line and the bit line, thereby contributing to improvement of reading margin of the memory cells. Therefore, it is preferred that noise cancel word line NCWL is disposed at the inner side of dummy word line DWL.

Although noise cancel word line NCWL is not directly concerned with reading of memory cells as described above, spare word line SWL replaces a normal word line when a deficiency occurs on the normal word line. After replacement, spare word line SWL is used for writing operation of a memory cell. Therefore, it is desired that spare word line SWL is disposed at the inner side of noise cancel word line NCWL.

Because of the similar reason, a spare bit line is preferably disposed at the inner side of dummy bit line DBL.

By disposing a dummy bit line, a spare bit line, a dummy word line, a noise cancel word line and a spare word line according to the above-described rule, uniformity in shape and yield of a normal bit line, word line and memory cell can be improved. At the same time, original functions of the spare bit line, the spare word line and the noise cancel word line are not damaged.

Figure 7:
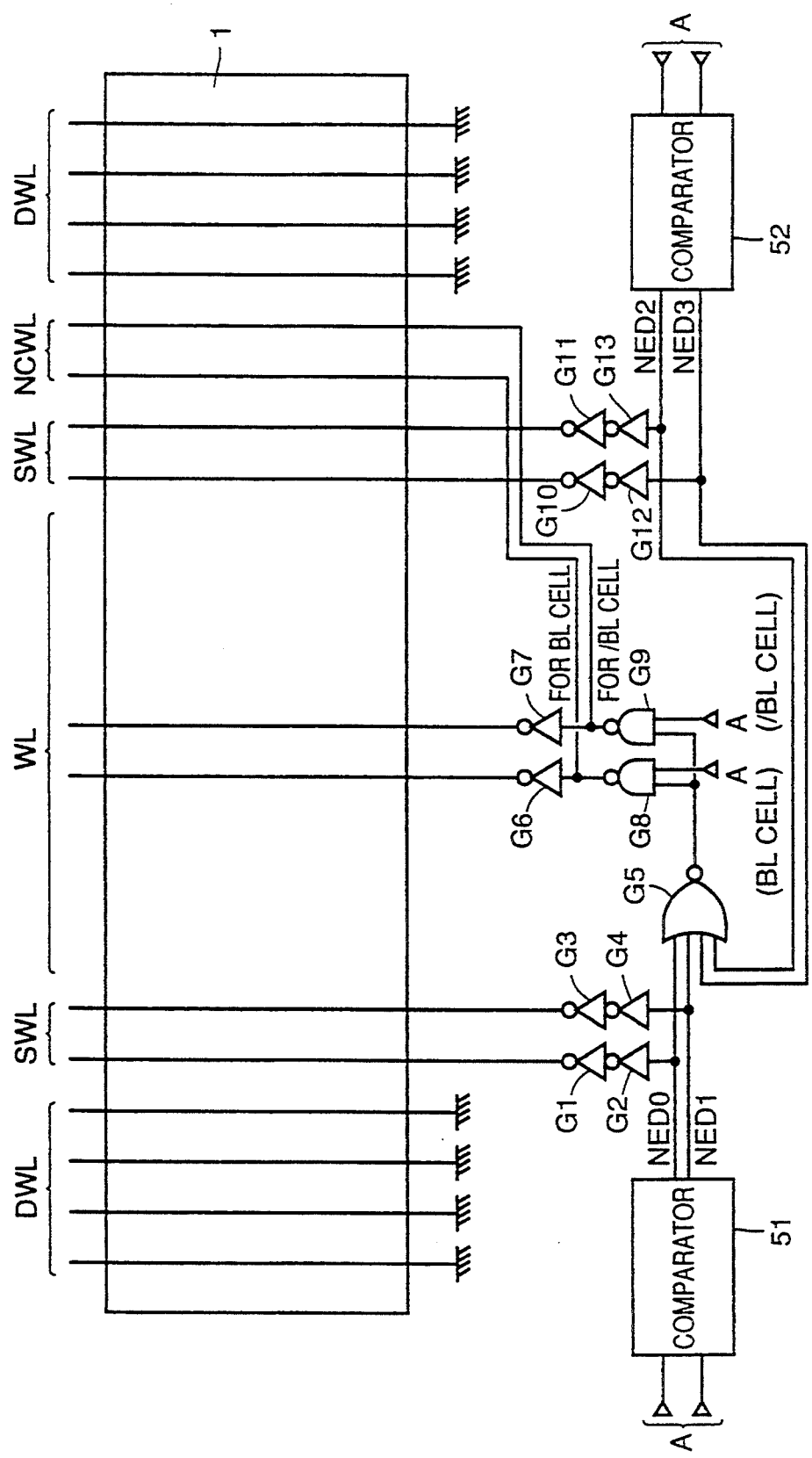
FIG. 7 is a diagram showing a configuration of a control circuit of a spare word line and a noise cancel word line.

Operation of the dummy word line, the spare word line and the noise cancel word line will now be described. FIG. 7 is a diagram showing a configuration of a control circuit controlling the spare word lines and the noise cancel word lines.

Referring to FIG. 7, the control circuit controlling the spare word lines and the noise cancel word lines includes comparators 51, 52 and gates G1 to G13.

Decoded address signal A for selecting a predetermined word line is applied to comparator 51. In response to address signal A, comparator 51 pulls up signal NED0 or signal NED1. In response to signal NED0 or signal NED1, a predetermined spare word line SWL is activated, and replaces a normal word line. Comparator 52 operates similarly.

An inverted signal of a logical sum of address signal A and signals NED0 to NED3 is applied to gate G8. Gate G8 outputs an inverted signal of a logical product of the input signal to noise cancel word line NCWL. The output of gate G8 is inverted at gate G6 for output to normal word line WL. Therefore, noise cancel word line NCWL is driven to the phase opposite to that of a word line at the time of word line selection, and cancels variation of the potential of a bit line caused by capacitance coupling of the word line and the bit line. Since dummy word line DWL does not function electrically, dummy word line DWL is connected to the ground potential.

Description will now be given of operation of the noise cancel word line in more detail. FIG. 8 is a diagram showing a configuration of the word line and the noise cancel word line.

As shown in FIG. 8, a memory cell 61 formed of a transistor Q61 and a capacitor C61 is connected to bit line BL and word line WL0. Similarly, a memory cell 62 is connected to word line WL1 and bit line /BL, a memory cell 63 is connected to noise cancel word line NCWL0 and bit line BL, and a memory cell 64 is connected to noise cancel word line NCWL1 and bit line /BL.

FIGS. 9(a)–9(d) is a first diagram explaining operation of the noise cancel word line. As shown in FIGS. 9(a)–9(d), when memory cell 61 is selected and word line WL0 rises, noise cancel word line NCWL0 is pulled down, and driven to the phase opposite to that of word line WL0. As a result, it is possible to cancel variation of the potential of a bit line caused by capacitance coupling between the word line and the bit line.

FIGS. 10(a)–10(d) is a second diagram explaining operation of the noise cancel word line. As shown in FIGS. 10(a)–10(d), when memory cell 62 is selected and word line WL1 rises, noise cancel word line NCWL1 is pulled down and driven to the phase opposite to that of word line WL1. Similar to the above, it is possible to cancel variation of the potential of a bit line caused by capacitance coupling between the word line and the bit line.

Figure 11:
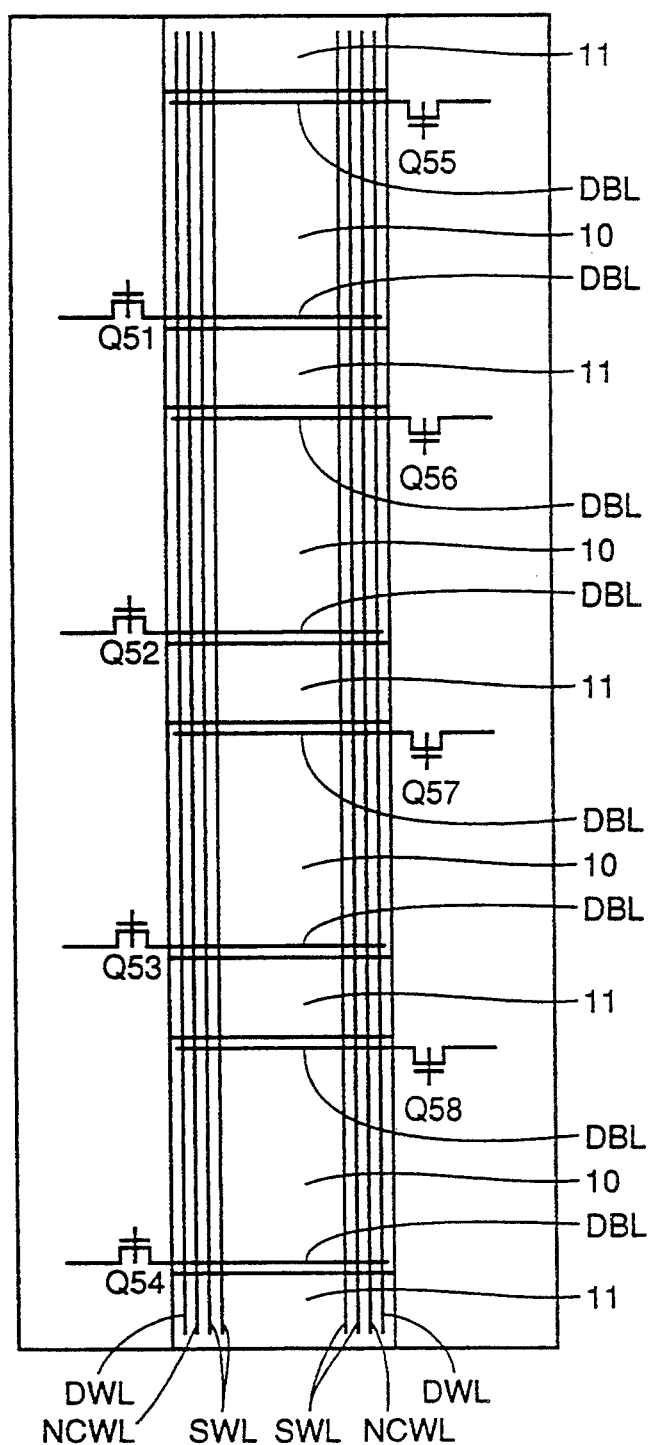
FIG. 11 is a diagram for explaining a second configuration of the memory array block shown in FIG. 1.

Description will now be given of the second configuration of the memory array block with reference to FIG. 11. The memory array block shown in FIG. 11 is different from the memory array block shown in FIG. 6 in that one dummy word line DWL, one noise cancel word line NCWL and two spare word lines SWL are disposed on the left side of memory array 10, and that one dummy word line DWL, one noise cancel word line NCWL and two spare word lines SWL are disposed on the right side of memory array 10 similarly. In the arrangement shown in FIG. 11, since respective word lines are disposed in symmetry, it is possible to improve uniformity in shape of normal word lines, bit lines and memory cells disposed at the inner side of respective word lines.

Another example of an arrangement of the noise cancel word line, the spare word line and the spare bit line will now be described.

Figure 12:
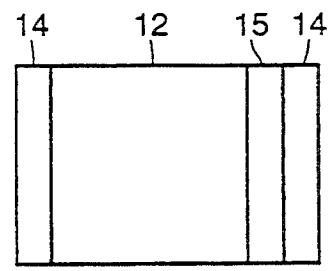
FIG. 12 is a diagram for explaining arrangement of a dummy word line and the noise cancel word line.

FIG. 12 is a diagram explaining an arrangement of the dummy word line and the noise cancel word line. As shown in FIG. 12, a region 14 for disposing a dummy word line is set on the left side of a region 12 for disposing a normal word line, a region 15 for disposing a noise cancel word line is set on the right side of region 12, and another region 14 is set on the right side of region 15.

Figure 13:
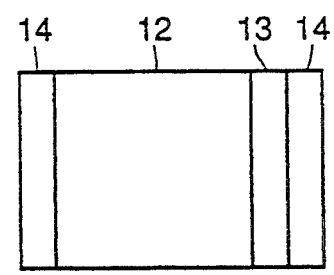
FIGS. 13 and 14 are diagrams for explaining first and second arrangements of the dummy word line and the spare word line, respectively.

FIG. 13 is a diagram explaining a first arrangement of the dummy word line and the spare word line. In FIG. 13, region 14 for disposing a dummy word line is set on the left side of region 12 for disposing a normal word line, a region 13 for disposing a spare word line is set on the right side of region 12, and another region 14 is set on the right side of region 13.

Figure 14:
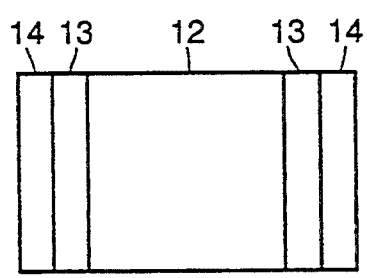

FIG. 14 is a diagram explaining a second arrangement of the dummy word line and the spare word line. In FIG. 14, region 13 for disposing a spare word line is set on the left side of region 12 for disposing a normal word line, and region 14 for disposing a dummy word line is set on the left side of region 13. Another region 13 is set on the right side of region 12, and another region 14 is set on the right side of another region 13.

Figure 15:
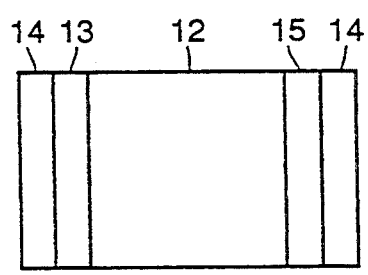
FIGS. 15 to 17 are diagrams for explaining first to third arrangements of the dummy word line, the noise cancel word line and the spare word line, respectively.

FIG. 15 is a diagram explaining a first arrangement of the dummy word line, the noise cancel word line, and the spare word line. In FIG. 15, region 13 for disposing a spare word line is set on the left side of region 12 for disposing a normal word line, and region 14 for disposing a dummy word line is set on the left side of region 13. A region 15 for disposing a noise cancel word line is set on the right side of region 12, and another region 14 is set on the right side of region 15.

Figure 16:
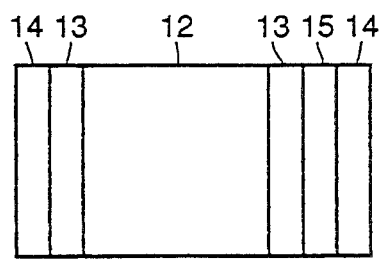

FIG. 16 is a diagram explaining a second arrangement of the dummy word line, the noise cancel word line and the spare word line. In FIG. 16, region 13 for disposing a spare word line is set on the left side of region 12 for disposing a normal word line, and region 14 for disposing a dummy word line is set on the left side of region 13. Another region 13 is set on the right side of region 12, region 15 for disposing a noise cancel word line is set on the right side of another region 13 and another region 14 is set on the right side of region 15.

Figure 17:
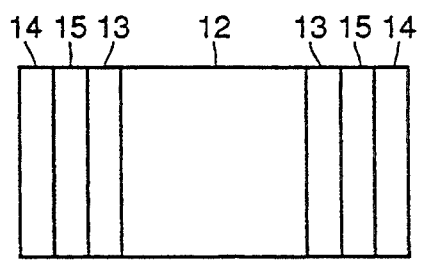

FIG. 17 is a diagram explaining a third arrangement of the dummy word line, the noise cancel word line and the spare word line. In FIG. 17, regions 13 for disposing a spare word line are set on the outer sides of region 12, regions 15 are set on the outer sides of regions 13, and regions 14 are set on the outer sides of regions 15.

Figure 18:
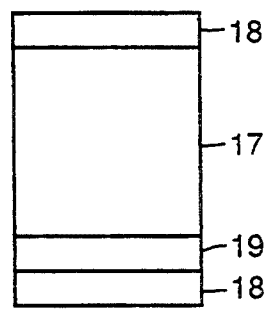
FIGS. 18 and 19 are diagrams for explaining first and second arrangements of the dummy bit line and the spare bit line.

Description will now be given of another arrangement example of the dummy bit line and the spare bit line. FIG. 18 is a diagram explaining a first arrangement of the dummy bit line and the spare bit line. In FIG. 18, a region 18 for disposing a dummy bit line is set on the upper side of a region 17 for disposing a normal bit line. A region 19 for disposing a spare bit line is set on the under side of region 17, and another region 18 is set on the under side of region 19.

Figure 19:
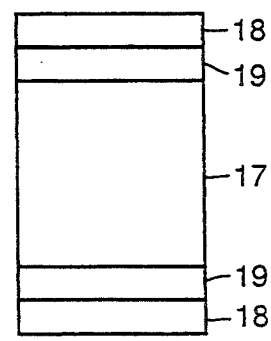

FIG. 19 is a diagram explaining a second arrangement of the dummy bit line and the spare bit line. In FIG. 19, regions 19 for disposing a spare bit line are set on the upper and lower sides of regions 17, and regions 18 are set on the upper and lower sides of regions 19.

The arrangement of the dummy bit line, the spare bit line, the dummy word line, the noise cancel word line and the spare word line is not limited to the above respective examples. The dummy word line has only to be disposed at the outermost side, and the noise cancel word line or spare word line has only to be disposed at the inner side of the dummy word line adjacent thereto. At least one dummy word line and at least one spare word line have only to be formed. The numbers of dummy word lines and spare word lines can be set according to the integration level. When both the spare word line and the noise cancel word line are used, the spare word line must be disposed inside.

The arrangement of the dummy bit line and the spare bit line is not limited to the above respective examples. The dummy bit line has only to be disposed at the outermost side, and the spare bit line has only to be disposed at the inner side of the dummy bit line adjacent thereto. At least one dummy bit line and at least one spare bit line has only to be disposed. The numbers of dummy bit lines and spare bit lines can be set according to the integration level.

In chip 7 including four planes as shown in FIG. 1, if the arrangement order of the dummy word line, the spare word line and the noise cancel word line, and the arrangement order of the dummy bit line and the spare bit line in memory array block 1 are set in the same pattern for the four planes, the address configuration is advantageously of the same pattern on the entire chip. When the arrangement order of the dummy word line, the spare word line and the noise cancel word line and the arrangement order of the dummy bit line and the spare bit line are set in symmetry with respect to the center of the four planes, the four planes are in symmetry with respect to the center of chip 7, facilitating the layout.

Figure 20:
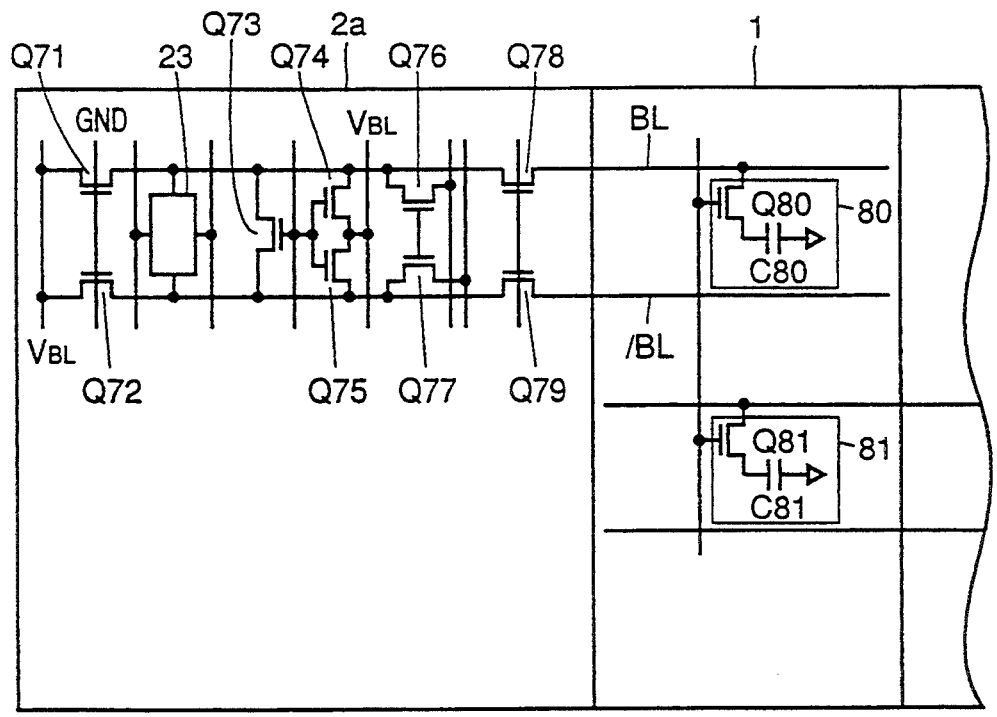
FIGS. 20 and 21 are first and second diagrams showing the configuration of the first control circuit having no memory array block provided on one side.
Figure 21:
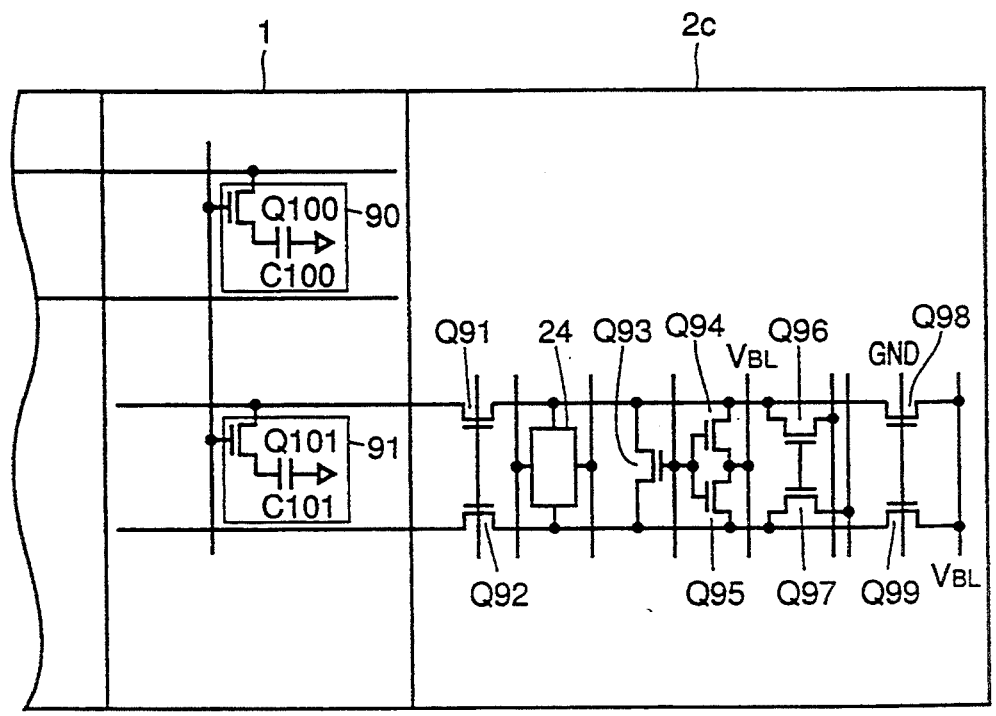

Description will now be given of first control circuits 2a, 2c, at one side of which memory array block 1 is not provided. FIGS. 20 and 21 are first and second diagrams showing the configuration of the first control circuit having a memory array block provided at only one side. First control circuits 2a, 2c shown in FIGS. 20, and 21 are different from first control circuit 2 shown in FIG. 2 in that contacts of first switch Q71, Q72 and fifth switch Q98, Q99 on the side where a memory array block is not provided are fixed to a predetermined potential $V_{BL}$ ($=V_{CC}/2$) to which the bit line pair is precharged, and that the ground potential is always applied to the gates of transistors Q71, Q72, Q98, Q99 configuring the first and fifth switches. As a result, it is possible to prevent the contacts from attaining an abnormal potential, thereby preventing malfunction of the device and improving reliability of the device.

Since the contacts are fixed to $V_{CC}/2$, which is an equalize level at the time of stand-by of the bit line pair, there are advantages that leakage current will not be generated by subthreshold leakage current in an off state of the transistor, and that standby-current will not increase.

Although the above embodiments are applied to the DRAM, by removing the noise cancel word line inherent to the DRAM, the present invention can be applied to other semiconductor memory devices in general, with the similar effects expected.

The present invention is not limited to a semiconductor memory device including four planes in two rows and two columns shown in FIG. 1. The present invention can be similarly applied to a semiconductor memory device including a plurality of planes, using four planes in two rows and two columns as a unit.

Figure 22:
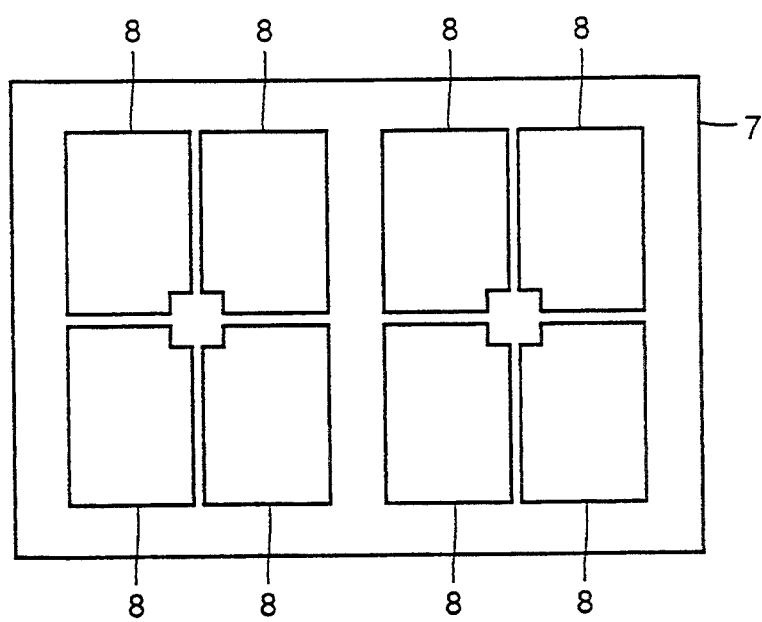
FIG. 22 is a diagram showing a configuration of a semiconductor memory device according to another embodiment of the present invention.

FIG. 22 is a diagram showing a configuration of a semiconductor memory device according to another embodiment of the present invention. In FIG. 22, the semiconductor memory device includes chip 7 and eight planes 8. The detailed configuration of each plane 8 is similar to the plane described with respect to FIG. 1. As shown in FIG. 22, since each plane does not have irregularity at its periphery, it is possible to easily implement superior uniformity in shape and high integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory array blocks disposed in the row direction;
   a plurality of first control circuits provided at either side of said respective memory array blocks and including at least a sense amplifier circuit;
   a column decoder disposed in parallel with the first control circuit provided at one end side out of said plurality of first control circuits;
   a plurality of row decoders provided corresponding to said memory array blocks; and
   a plurality of second control circuits provided corresponding to said first control circuits, wherein
   a width of a forming region of each said plurality of row decoders in a surface of a semiconductor substrate is substantially equal to a width of a forming region of each said memory array blocks in the surface of the semiconductor substrate, and
   the second control circuits are formed in the same pattern excluding the second control circuit corresponding to one first control circuit positioned on said column decoder side out of the plurality of first control circuits.

2. The semiconductor memory device as recited in claim 1, wherein
   a width of a forming region of each of the second control circuits formed in the same pattern out of said plurality of second control circuits in the surface of the semiconductor substrate is substantially equal to a sum of a width of a forming region of each of said first control circuits in the surface of the semiconductor substrate and the width of the forming region of each said row decoders in the surface of the semiconductor substrate.

3. The semiconductor memory device as recited in claim 2, wherein
   a forming region of the second control circuit positioned on said column decoder side out of said second control circuits in the surface of the semiconductor substrate extends to a side surface of a corresponding first control circuit out of said first control circuits, with its end portion positioned inside of an end portion of said column decoder.

4. The semiconductor memory device as recited in claim 3, wherein
   each of said plurality of row decoders is disposed between corresponding said memory array block and said second control circuit.

5. The semiconductor memory device as recited in claim 1, further comprising
   a plurality of interconnection regions for connecting said first control circuits and corresponding said second control circuits, wherein a part of the second control circuits formed in the same pattern out of said plurality of second control circuits is disposed in said interconnection region.

6. The semiconductor memory device as recited in claim 5, wherein
   said memory array block includes
   a plurality of memory cells disposed in the row and column directions,
   a plurality of word lines for selecting memory cells in the row direction out of said plurality of memory cells,
   a plurality of bit lines connected to said sense amplifier circuit and selecting memory cells in the column direction out of said plurality of memory cells,
   each of the second control circuits formed in the same pattern out of said plurality of second control circuits include
   a memory array block control circuit for controlling at least said memory array block,
   said memory array block control circuit includes
   a word line activate signal generating circuit generating a signal for activating a predetermined word line out of said plurality of word lines, and
   a bit line separation signal generating circuit generating a bit line separation signal for controlling connection between a predetermined bit line out of said plurality of bit lines and said sense amplifier circuit,
   portions of said word line activate signal generating circuit and said bit line separation signal generating circuit are disposed in a portion of said interconnection region.

7. The semiconductor memory device as recited in claim 6, wherein
   the portion of said interconnection region includes
   a first region positioned at one end on said column decoder side of said interconnection region, and
   a second region positioned at the other end opposite to said column decoder side of said interconnection region,
   the second control circuits formed in the same pattern out of said plurality of second control circuits are disposed in contact with two said interconnection regions,
   one side on said column decoder side of each of the second control circuits formed in the same pattern out of the second control circuits is substantially aligned with a side on said column decoder side of the second region of the interconnection region on the column decoder side out of said two interconnection regions, and
   the other side of each of the second control circuits formed in the same pattern out of the second control circuits is substantially aligned with a side on said column decoder side of the second region on the interconnection region on the side opposite to the column decoder side out of said two interconnection regions.

8. The semiconductor memory device as recited in claim 1, wherein
   each of the second control circuits formed in the same pattern out of said plurality of second control circuits includes
   a memory array block control circuit controlling operation of a corresponding memory array block out of said plurality of memory array blocks, and
   a sense amplifier control circuit controlling operation of a sense amplifier circuit included in a corresponding first control circuit out of said plurality of first control circuits, the second control circuit positioned on said column decoder side out of said plurality of second control circuits includes said sense amplifier control circuit.

9. The semiconductor memory device as recited in claim 8, wherein said memory array block control circuit includes a predecode signal generating circuit generating a predecode signal, a noise cancel word line drive circuit driving a noise cancel word line, a word line activate signal generating circuit generating a signal for activating a word line, spare word line selection circuitry selecting a spare word line, and a bit line separation signal generating circuit generating a bit line separation signal, said sense amplifier control circuit includes a bit line equalize signal generating circuit generating a bit line equalize signal, and a sense amplifier drive signal generating circuit generating a sense amplifier drive signal.

10. The semiconductor memory device as recited in claim 9, wherein said sense amplifier control circuit further includes a switch gate control signal generating circuit generating a signal controlling a switch gate for connecting a sub input/output line and a main input/output line.

11. The semiconductor memory device as recited in claim 1, further comprising two forming regions in the surface of the semiconductor substrate each including said plurality of memory array blocks, said plurality of first control circuits, said column decoder, said plurality of row decoders and said plurality of second control circuits, wherein said column decoder is disposed at the center side of said two forming regions in the surface of the semiconductor substrate.

12. The semiconductor memory device as recited in claim 1, wherein each of said plurality of memory array blocks includes a plurality of memory cells disposed in the row and column directions, a plurality of select lines selecting memory cells in one direction of the row and column directions out of said plurality of memory cells, dummy select lines disposed on the outer sides of select lines on both ends out of said plurality of select lines, and having substantially the same shape as that of said select line, and a spare select line disposed between said dummy select lines and said plurality of select lines, and having substantially the same shape as that of said select line.

13. The semiconductor memory device as recited in claim 12, wherein said plurality of select lines include a plurality of word lines selecting memory cells in the row direction out of said plurality of memory cells, said dummy select line includes a dummy word line having substantially the same shape as that of said word line, and said spare select line includes a spare word line having substantially the same shape as that of said word line.

14. The semiconductor memory device as recited in claim 13, wherein said memory array block further includes a noise cancel word line disposed between said dummy word lines and said spare word line for canceling variation of a potential of said bit line.

15. The semiconductor memory device as recited in claim 12, wherein said plurality of select lines include a plurality of bit lines selecting memory cells in the column direction out of said plurality of memory cells, said dummy select line includes a dummy bit line having substantially the same shape as that of said bit line, and said spare select line includes a spare bit line having substantially the same shape as that of said bit line.

16. The semiconductor memory device as recited in claim 1, wherein each of said memory blocks includes a plurality of memory cells disposed in the row and column directions, a plurality of word lines selecting memory cells in the row direction out of said plurality of memory cells, a plurality of bit lines selecting memory cells in the column direction out of said plurality of memory cells, dummy word lines disposed on the outer sides of word lines on both ends out of said plurality of word lines, and having substantially the same shape as that of said word line, and a noise cancel word line disposed between said dummy word lines and said plurality of word lines for canceling variation of a potential of said bit line.

17. The semiconductor memory device as recited in claim 1, wherein each of said plurality of first control circuits further includes first and second connecting means for selectively connecting said sense amplifier circuit and one of said memory array blocks disposed on both sides, and each connection point of said first and second connecting means of said first control circuit not having said memory array block connected thereto is fixed to a predetermined potential.

18. The semiconductor memory device as recited in claim 17, wherein each of said plurality of memory array blocks includes a plurality of memory cells disposed in the row and column directions, a plurality of word lines selecting memory cells in the row direction out of said plurality of memory cells, and a plurality of bit lines selecting memory cells in the column direction out of said plurality of memory cells, said predetermined potential includes a precharge potential to which said bit line is precharged.

19. A semiconductor memory device, comprising:

a plurality of memory cells disposed in the row and column directions;

a plurality of select lines selecting memory cells in one direction of the row and column directions out of said plurality of memory cells;

dummy select lines disposed on the outer sides of select lines on both ends out of said plurality of select lines, and having substantially the same shape as that of said select line; and a spare select line disposed between said dummy select lines and said plurality of select lines, and having substantially the same shape as that of said select line.

20. The semiconductor memory device as recited in claim 19, wherein said select line includes a plurality of word line selecting memory cells in the row direction out of said plurality of memory cells, said dummy select line includes a dummy word line having substantially the same shape as that of said word line, and said spare select line includes a spare word line having substantially the same shape as that of said word line.

21. The semiconductor memory device as recited in claim 20, further comprising:

a plurality of bit lines selecting memory cells in the column direction out of said plurality of memory cells; and a noise cancel word line disposed between said dummy word line and said spare word line for canceling variation of a potential of said bit line.

22. The semiconductor memory device as recited in claim 19, wherein said plurality of select lines includes a plurality of bit lines selecting memory cells in the column direction out of said plurality of memory cells, said dummy select line includes a dummy bit line having substantially the same shape as that of said bit line, and said spare select line includes a spare bit line having substantially the same shape as that of said bit line.

23. A semiconductor memory device, comprising:

a plurality of memory cells disposed in the row and column directions;

a plurality of word lines selecting memory cells in the row direction out of said plurality of memory cells;

a plurality of bit lines selecting memory cells in the column direction out of said plurality of memory cells;

dummy word lines disposed on the outer sides of word lines on both ends out of said plurality of word lines, and having substantially the same shape as that of said word line; and a noise cancel word line disposed between said dummy word lines and said plurality of word lines for canceling variation of a potential of said bit line.

24. A semiconductor memory device, comprising:

a plurality of memory array blocks disposed in the row direction for storing information; and a plurality of amplifying means disposed on either side of said respective memory array blocks for amplifying an information signal provided from said memory array block, wherein each of said plurality of amplifying means further includes first and second connecting means for selectively connecting one of memory array blocks disposed on both ends out of said plurality of memory array blocks, each connection point of said first and second connecting means of the amplifying means not having said memory array block connected thereto is fixed to a predetermined potential.

25. The semiconductor memory device as recited in claim 24, wherein each of said memory array blocks includes a plurality of memory cells disposed in the row and column directions, a plurality of word lines selecting memory cells in the row direction out of said plurality of memory cells, and a plurality of bit lines selecting memory cells in the column direction out of said plurality of memory cells, said predetermined potential includes a precharge potential to which said bit line is precharged.

* * * * *